United States Patent
Kawazoe et al.

(10) Patent No.: US 6,294,274 B1
(45) Date of Patent: Sep. 25, 2001

(54) OXIDE THIN FILM

(75) Inventors: Hiroshi Kawazoe, 1887, Taya - cho, Sakac - Ku, Yokohama - shi, Kanagawa; Hideo Hosono, Yamato; Atsushi Kudo, Yono; Hiroshi Yanagi, Sagamihara, all of (JP)

(73) Assignees: TDK Corporation, Tokyo; Hiroshi Kawazoe, Yokohama, both of (JP)

( * ) Notice: Subject to any disclaimer, the term of this patent is extended or adjusted under 35 U.S.C. 154(b) by 0 days.

(21) Appl. No.: 09/350,914

(22) Filed: Jul. 12, 1999

(30) Foreign Application Priority Data

Nov. 16, 1998 (JP) .................................................. 10-342364

(51) Int. Cl.[7] .............................. C01G 3/02; C01F 11/02
(52) U.S. Cl. ........................ 428/697; 428/332; 428/432; 428/469; 428/699; 428/701; 428/702; 423/604; 423/635; 320/101
(58) Field of Search ................................... 428/426, 432, 428/450, 469, 471, 689, 697, 701, 702, 699, 700, 213, 332; 423/604, 635; 320/101

(56) References Cited

FOREIGN PATENT DOCUMENTS

04268527 * 9/1992 (JP) .
04194096 * 8/1993 (JP) .
05194095 * 8/1993 (JP) .

OTHER PUBLICATIONS

Alcock et al. "Thermodynamic Study of the Cu–Sr–O system", J. American Ceramics Soc., 73 (5) pp 1176–1180, May 1990.*

Li et al. "Observation of Resistive and Magenetic Anomalies at 90–180 K in Artificially Layered Ca1–x Srx CuO2 Thin Films Grown by Laser Molecular Beam Epitaxy", Jpn. J. Appl. Phys. vol. 31 pp. 934–937, Jul. 1992.*

Kudo et al., "SrCu2O2: A p–type conductive oxide with wide band gap", Applied Physics Letters, vol. 73, No. 2, Jul. 13, 1998. pp 220–222, 1998.*

A. Kudo, et al., Applied Physics Letters, vol. 73, No. 2, pp. 220–222, "$SrCu_2O_2$: A p–Type Conductive Oxide with Wide Band Gap", Jul. 13, 1998.

H. Kawazoe, et al., Letters to Nature, vol. 389, pp. 939 to 942, "P–Type Electrical Conduction in Transparent Thin Films of $CuAlO_2$", Oct. 30, 1997.

* cited by examiner

Primary Examiner—Blain Copenheaver
Assistant Examiner—Stephen Stein
(74) Attorney, Agent, or Firm—Oblon, Spivak, McClelland, Maier & Neustadt, P.C.

(57) ABSTRACT

An object of the invention is to provide an oxide thin film which exhibits a widegap or transparency and p-type conductivity although it has heretofore been very difficult to form. The oxide thin film formed on a substrate contains copper oxide and strontium oxide as a main component and exhibits p-type conductivity at a bandgap of at least 2 eV.

20 Claims, 4 Drawing Sheets

OXIDE THIN FILM

BACKGROUND OF THE INVENTION

1. Technical Field

This invention relates to an oxide thin film having a widegap or transparency and p-type conductivity.

2. Background Art

Transparent conductive oxides such as ITO are controllable from an insulation of about $10^{-9}$ S/cm to a conductivity of about $10^4$ S/cm. Despite this outstanding characteristic, transparent conductive oxides are merely applied as transparent electrodes in flat panel displays and solar batteries. In the semiconductor application, a p-n junction is an important structure. However, since prior art transparent conductive oxides are all of n type and no transparent conductive oxides of p type are available, it is difficult to form a p-n junction solely from transparent conductive oxides. If formation of p-type conductive thin film becomes possible, it can be combined with prior art n-type semiconductor to form a p-n junction, which enables the fabrication of UV light-emitting diodes and transparent transistors.

For such a purpose, the inventor Kawazoe et al. reported that delafosite oxide exhibits widegap p-type conductivity (see Nature, No. 389, 1997, page 941, H. Kawazoe, M. Yasukawa, H. Hyodo, M. Kurita, H. Yanagi, H. Hosono "P-type electrical conduction in transparent thin films of $CuAlO_2$"). However, the thin film formation temperature is as high as 700° C. There is a desire to have a thin film which can be formed at lower temperatures for wider application.

SUMMARY OF THE INVENTION

An object of the invention is to provide an oxide thin film which exhibits a widegap or transparency and p-type conductivity although it has heretofore been very difficult to form.

The above and other objects are achieved by the construction defined below as (1) to (3).

(1) An oxide thin film formed on a substrate, comprising copper oxide and strontium oxide as a main component and exhibiting p-type conductivity at a bandgap of at least 2 eV.

(2) The oxide thin film of (1) wherein the main component is $SrCu_2O_2$.

(3) The oxide thin film of (1) which is doped with potassium.

FUNCTION

The oxide thin film of the invention uses an oxide containing strontium oxide and copper oxide and having a basic composition represented by $SrCu_2O_2$. It has been discovered that when a thin film is formed of $SrCu_2O_2$, a widegap, p-type conductivity oxide thin film is obtained even at a thin film forming temperature of about 300° C.

In general, a study on the electron structure of an oxide reveals the strong localization of a hole at the upper end of a valence band due to the nature of $2p^6$ electron orbit of an oxygen ion. This suggests that even if a hole is successfully created by any suitable means in order to provide a p-type transparent conductive thin film, the hole is localized on the oxygen ion and has a deep level that cannot be ionized at room temperature, failing to provide p-type conductivity. By contraries, a p-type transparent conductive thin film may be obtained if the strong localization of a hole at the upper end of a valence band is mitigated.

To this end, a cation such as $Cu^+$, $Ag^+$ or $Au^+$ is introduced into an oxide. Since such a cation has a $d^{10}$ electron level in close proximity to the $2p^6$ electron level of an oxygen ion, these levels become hybridized. The hybridized electron level of cation and oxygen ion mitigates the strong hole localization at the upper end of a valence band. Searching for a complex oxide exhibiting such effect, the inventors have discovered that $SrCu_2O_2$ exerts the outstanding effect.

Figure 1:
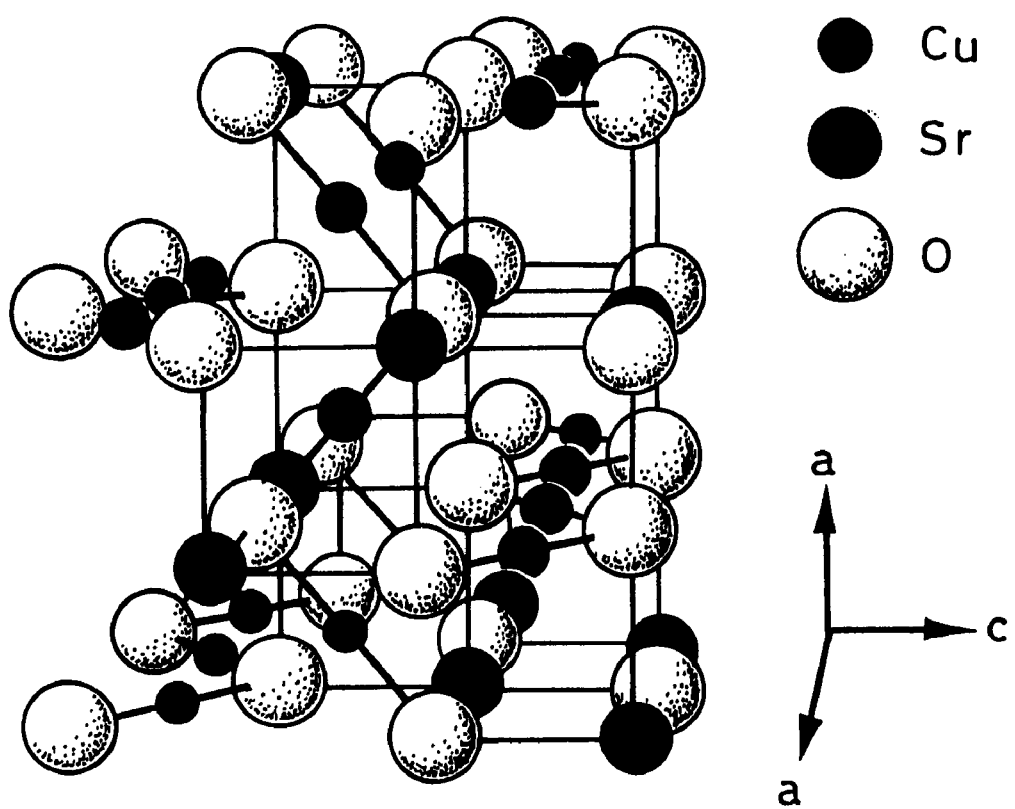
FIG. 1 schematically illustrates the crystalline structure of $SrCu_2O_2$ thin film.

FIG. 1 illustrates the crystalline structure of $SrCu_2O_2$. This crystal contains dumbbell structures of O—Cu—O associated with $Cu_2O$. $Cu_2O$ is known as a p-type conductor having a bandgap of 2.1 eV. The bond length between Cu and oxygen in the dumbbell structure in the $SrCu_2O_2$ crystal is 184 pm, which is approximate to the bond length between Cu and oxygen in $Cu_2O$. The structure is thus likely to provide p-type conductivity.

The dumbbell unit structures are bound zigzag to form one-dimensional chains in [100] and [010] directions. The chains in [100] and [010] directions are at an angle of 96.25°. The electronic interaction between $Cu^+$ and adjacent $Cu^+$ within the one-dimensional structure of dumbbell chains is small as compared with that of $Cu_2O$ having a three-dimensional structure. That is, the one-dimensional structure of O—Cu—O dumbbell has a wide bandgap as compared with $Cu_2O$. Therefore, $SrCu_2O_2$ has a greater bandgap than $Cu_2O$ having a bandgap of 2.1 eV, spreading to about 3.2 eV.

On the other hand, holes are created in $SrCu_2O_2$ by Cu holes ionized in the crystal or excessive oxygen as in the case of $Cu_2O$. Also, an Sr ion has six oxygen ions coordinated therewith and assumes a somewhat deformed oxygen octahedron as a unit lattice. Therefore, more holes can be introduced by substituting K for Sr.

It has thus been found that when a thin film is formed using $SrCu_2O_2$ as the oxide thin film composition, there is obtained a widegap, p-type conductivity oxide thin film.

DESCRIPTION OF THE PREFERRED EMBODIMENTS

The oxide thin film of the invention includes at least a substrate and an oxide thin film formed on the substrate and containing strontium oxide and copper oxide. It is preferred to offset the Sr/Cu ratio of the oxide or dope the oxide with potassium in order to increase the p-type conductivity thereof.

The composition of the oxide thin film of the invention containing strontium oxide and copper oxide is represented by $SrCu_2O_2$ or $SrCu_2O_2$ with K added thereto.

While $SrCu_2O_2$ generally has a ratio of Sr:Cu:O=1:2:2, the oxide thin film preferably has the following ratio of elements:

Sr/Cu=0.8 to 1.3, and
O/(Sr+Cu)=0.55 to 0.75,
and more preferably
Sr/Cu=0.9 to 1.2, and
O/(Sr+Cu)=0.65 to 0.70.

A too greater Sr/Cu ratio compromises crystallinity whereas a too low Sr/Cu ratio makes it difficult to provide p-type conductivity and makes it impossible to control O/(Sr+Cu). By controlling O/(Sr+Cu) to fall within the above range, good p-type conductivity is achievable. With too low a O/(Sr+Cu) ratio, the effect of improving crystallinity is not achievable and at the same time, p-type conductivity is lost. With too high a O/(Sr+Cu) ratio, on the other hand, similarly crystallinity is exacerbated and at the same time, p-type conductivity is lost. In order that the effect of adding element K be exerted, that is, p-type conductivity be improved, it is preferred to set K/Sr=0.05 or less and Sr:K=approximately 0.97:0.03. With K/Sr beyond 0.05, the doping effect is reduced and crystallinity is exacerbated. The above-defined range can be readily accomplished by controlling the oxide thin film forming conditions.

The contents of Sr, Cu, K and O may be determined by fluorescent x-ray analysis.

The oxide thin film may take the form of an amorphous thin film, microcrystalline thin film, polycrystalline thin film, epitaxial thin film, single crystal thin film or a thin film of a mixture thereof, or a multilayer thin film thereof, or an artificial lattice thin film. Particularly when the oxide thin film is used for display purpose on a glass substrate as a transparent electrode or a functional film for a transistor, solar battery or organic EL, a polycrystalline thin film is preferable. Since the polycrystalline thin film can be formed over a large area and has crystallinity, it becomes possible to take advantage of the semiconductor characteristics of the oxide thin film.

The material of the substrate used herein is not critical. There may be used any one of amorphous substrates, for example, glass, quartz and organic material sheets; and crystal substrates of insulating materials such as magnesia, strontium titanate, sapphire, zirconia, stabilized zirconia, lithium niobate, and lithium tantalate, and semiconductors such as gallium arsenide, silicon, ZnSe, ZnS, GaP, and InP. Also useful are such amorphous or crystalline substrates having a crystalline, amorphous or metallic buffer layer or functional film formed thereon. Exemplary functional films are n-type oxide functional films of ITO, ZnO and the like. As the metal substrate, Mo, Al, Pt, Ir, Au, Pd, etc. are useful. Preferably, transparent substrates, typically glass substrate are used. The transparent substrates are best suited in the application where the "transparent" feature of the widegap, p-type conductivity oxide thin film of the invention is utilized.

Preferably the oxide thin film has good crystallinity and a flat surface so that a thin film to be formed thereon may exert better performance.

The crystallinity of a thin film may be determined in terms of the half-value width of a rocking curve of a reflection peak in x-ray diffractometry (XRD) or the pattern of a RHEED image. The surface flatness may be determined by a surface roughness (ten-point average roughness) as measured by AFM.

When the surface roughness Rz (ten-point average roughness, reference distance 500 nm) is measured by AFM, the thin film preferably has a surface roughness Rz of up to 10 nm, especially up to 2 nm. It is desired that the surface roughness of this order is established over an area of at least 80%, more preferably at least 90%, and further preferably at least 95% of the surface of a thin film. The above-described surface roughness is a value obtained when a thin film is formed over the entire surface of a substrate of 10 cm$^2$ in area and measurement is made at arbitrary ten points distributed randomly thereon. At present, the lower limit of Rz is about 1 nm.

The thickness of the oxide thin film varies with a particular application. The film thickness preferably ranges from 5 nm to 3 $\mu$m, and more preferably from 100 nm to 1.5 $\mu$m, with the preferred thickness being in the range having no detrimental influence on crystallinity and surface smoothness. When the oxide thin film functions as an electrode layer, it preferably has a thickness of about 50 to 500 nm.

As to the formation of oxide thin film, a thin film can be formed by a prior art vacuum evaporation process, sputtering process, laser ablation process, multi-source reactive evaporation process, or MBE apparatus. In particular, a polycrystalline thin film can be formed at a substrate temperature of about 50 to about 300° C. Also, at a substrate temperature of above 600° C., epitaxial thin film formation is possible.

EXAMPLE

Examples of the invention are given below by way of illustration.

Example 1

Using a laser ablation process, a $SrCu_2O_2$ thin film was formed on a mirror-finished glass substrate by the following steps.

First, a target to be used in the laser ablation process was made. $Cu_2O$ (99.5%) and $SrCO_3$ (99.9%) were mixed at a ratio of 1:1 as raw materials and in a $N_2$ gas stream, they were reacted at 950° C. for 40 hours. The sintered mass was ground and molded into pellets by means of a rubber press under a pressure of 800 kg/cm$^2$. While $N_2$ gas was passed, the pellets were sintered at 850° C. for 10 hours, yielding a target. By the XRD of FIG. 2(c), this target was confirmed to be a $SrCu_2O_2$ single phase.

The substrate and the target were placed in a vacuum chamber, which was evacuated to $10^{-6}$ Pa. The laser used was a KrF excimer laser (wavelength 248 nm, Lamba Physik ComPex 102). While being rotated, the target was irradiated with laser light at an angle of 30°. The laser was pulse operated at 1 to 2 Hz to produce an energy quantity of 2.5 J/cm$^2$ per pulse.

With oxygen introduced into the vacuum chamber to a pressure of $7.0 \times 10^{-4}$ Pa, a thin film was formed to a thickness of 150 nm at a substrate temperature of 300° C.

Figure 2:
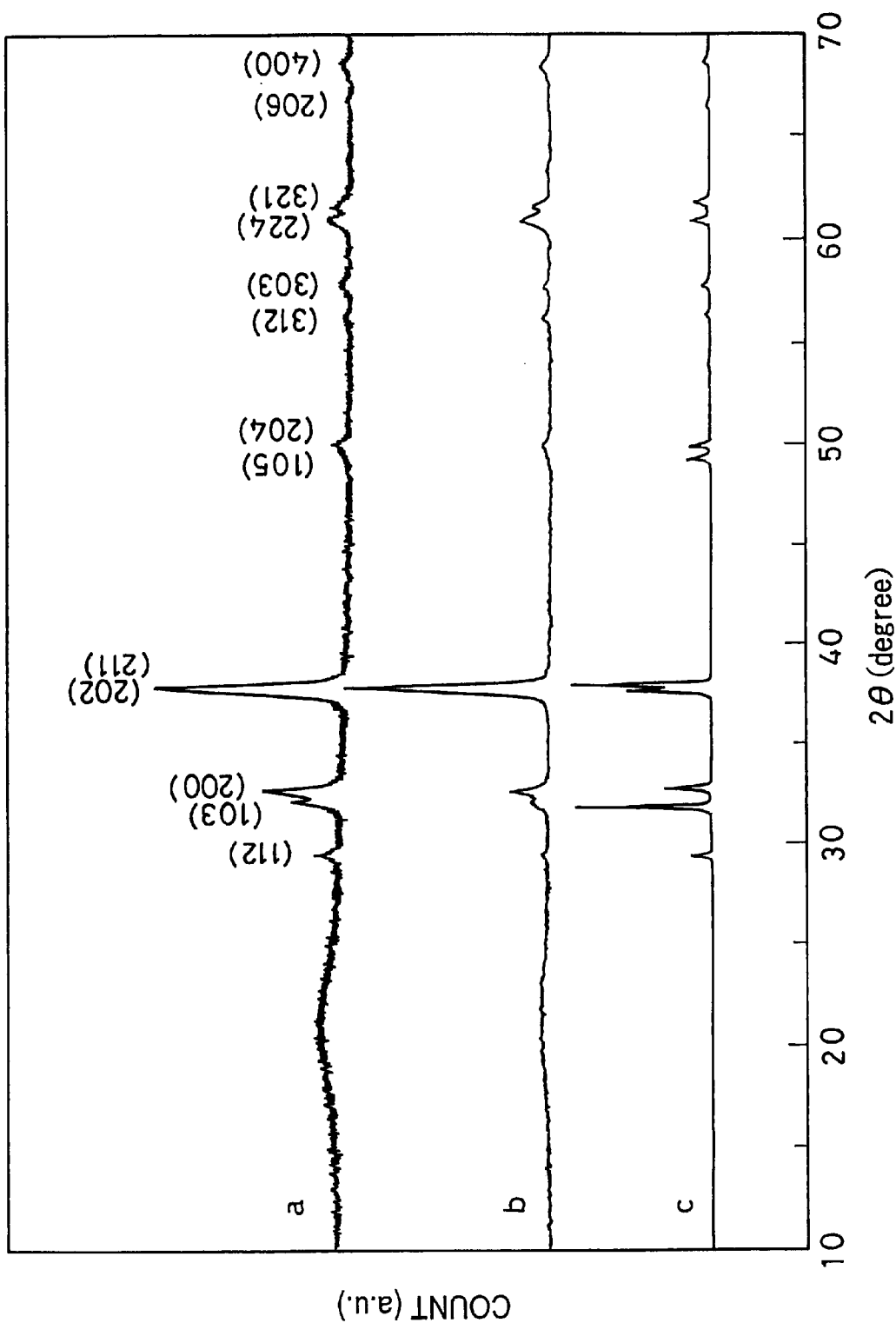
FIG. 2 is an XRD chart of oxide thin films of the invention, curve (a) representing a $SrCu_2O_2$ thin film, curve (b) representing a K-doped $SrCu_2O_2$ thin film, and curve (c) representing a film deposited using an undoped $SrCu_2O_2$ target.

The thus obtained $SrCu_2O_2$ thin film was examined by XRD. FIG. 2(a) represents the XRD pattern of this thin film. From this pattern, the $SrCu_2O_2$ thin film was confirmed to be a polycrystalline thin film. Also, the film was measured for ten-point average roughness Rz (reference distance L: 500 nm) according to JIS B-0610 at ten points distributed generally throughout the surface. The surface was flat as demonstrated by a roughness of 3.3 nm on the average, 5.0 nm at maximum, and 1.3 nm at minimum.

Figure 3:
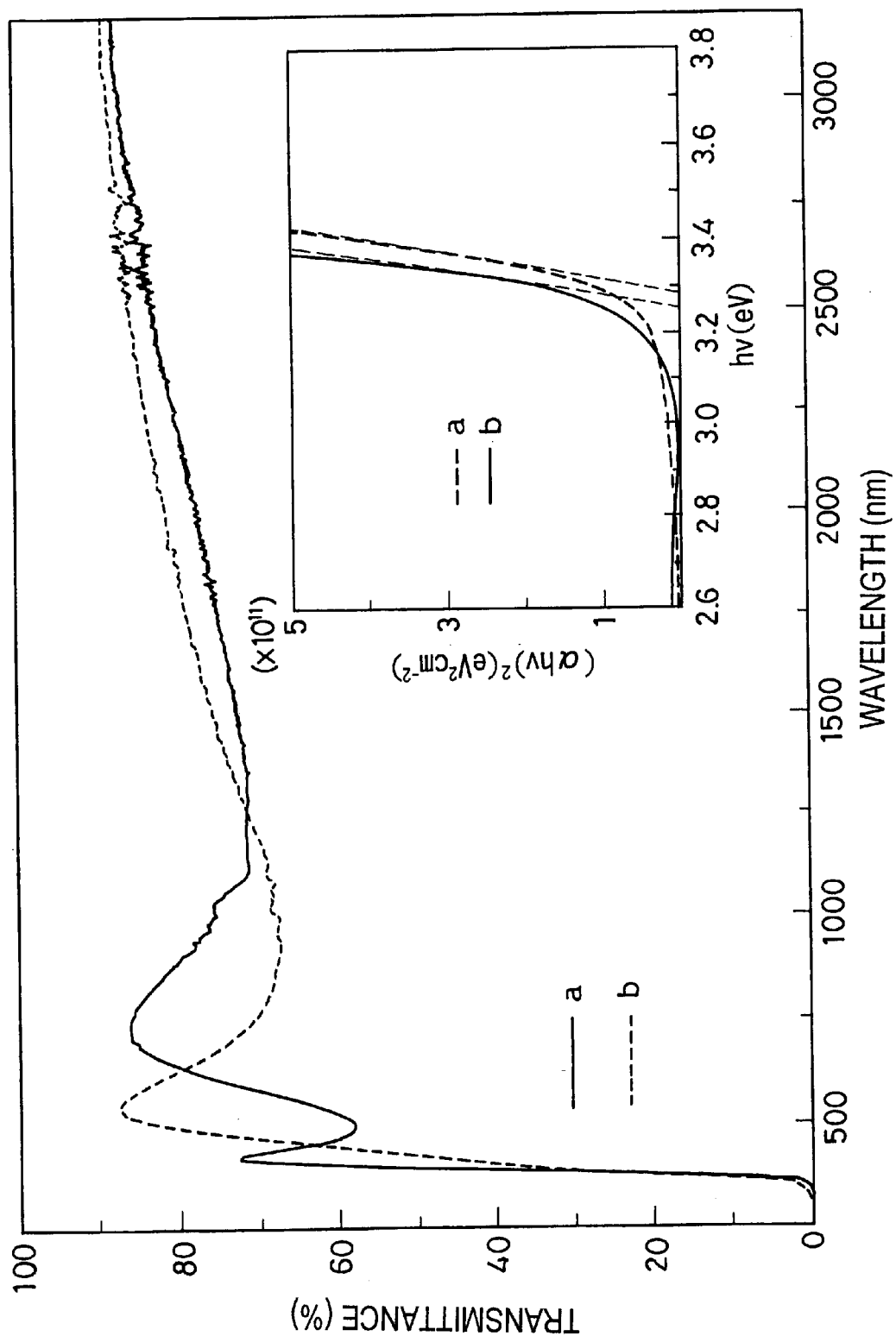
FIG. 3 is a light transmission spectrum, curve (a) representing an undoped $SrCu_2O_2$ thin film formed on a glass substrate and curve (b) representing a K-doped $SrCu_2O_2$ thin film.

The $SrCu_2O_2$ thin film was measured for light transmission characteristics. FIG. 3(a) represents its transmission spectrum. From this spectrum, the $SrCu_2O_2$ thin film was confirmed to be transparent in the visible and infrared regions. Also from this spectrum, the bandgap of the $SrCu_2O_2$ thin film was calculated to be about 3.3 eV.

Figure 4:
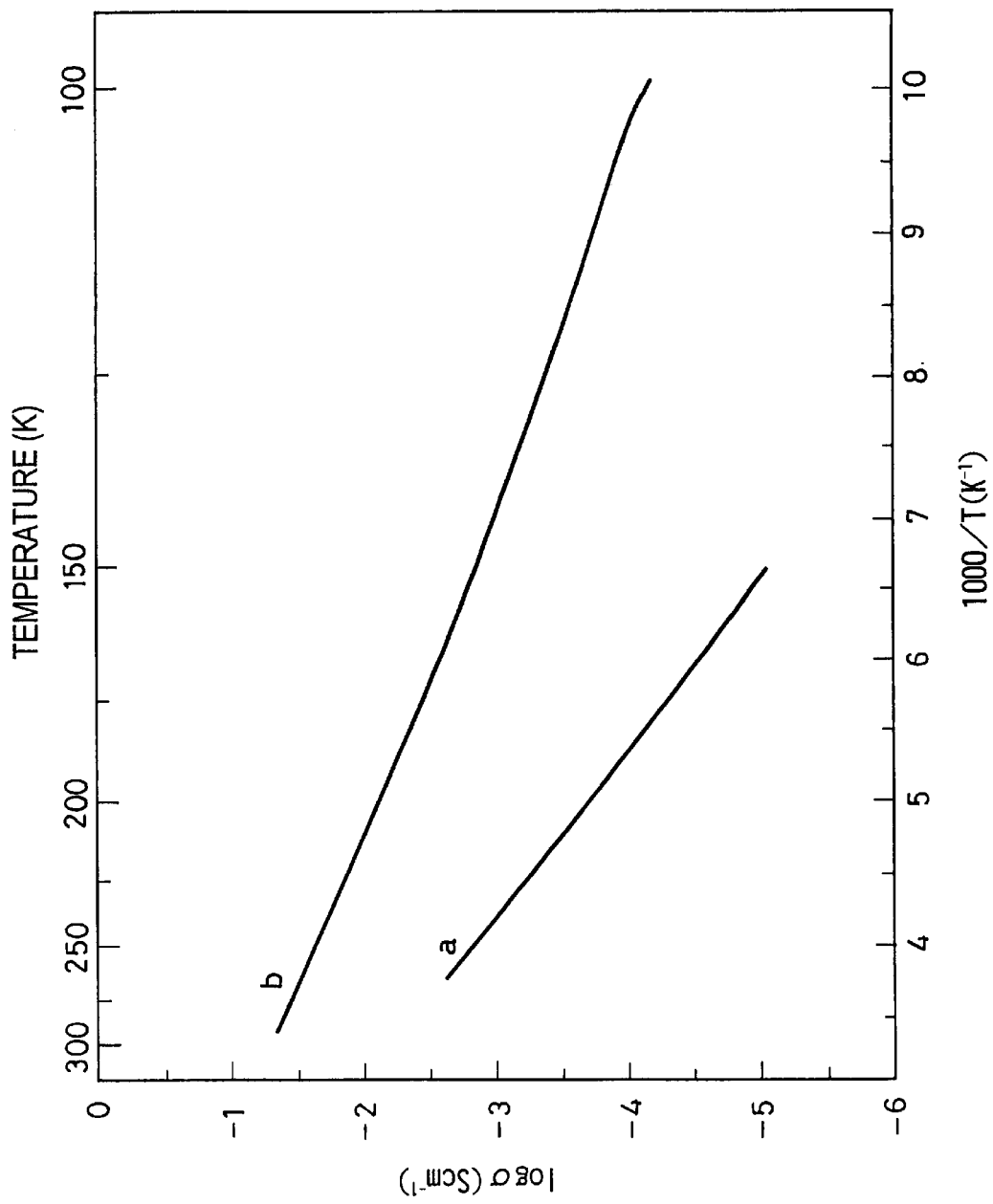
FIG. 4 is a graph showing the temperature dependency of electrical conductivity of (a) an undoped $SrCu_2O_2$ thin film and (b) a K-doped $SrCu_2O_2$ thin film.

The electric conductivity of the $SrCu_2O_2$ thin film was measured over the range from 150K to 300K by the two-terminal method. The results are shown in FIG. 4(a). The conductivity was $3.9\times10^{-3}$ S/cm at 300K. From the measurement of Seebeck constant and Hall constant, the film was confirmed to be p-type conductive.

Example 2

A K-doped $SrCu_2O_2$ thin film was prepared by the same procedure as in Example 1.

As the target, pellets of $Cu_2Sr_{0.97}K_{0.03}O_2$ obtained by substituting $K_2CO_0$ for 3 at % of the raw material $SrCO_3$ were used. The target preparation conditions were as in Example 1.

Under the same deposition conditions as in Example 1, a K-doped $SrCu_2O_2$ thin film was formed to a thickness of 120 nm.

The thus obtained K-doped $SrCu_2O_2$ thin film was examined by XRD. FIG. 2(b) represents the XRD pattern of this thin film. From this pattern, the K-doped $SrCu_2O_2$ thin film was confirmed to be a polycrystalline thin film. Also, the film was measured for ten-point average roughness Rz (reference distance L: 500 nm) according to JIS B-0610 at ten points distributed generally throughout the surface. The surface was flat as demonstrated by a roughness of 4.3 nm on the average, 5.0 nm at maximum, and 1.3 nm at minimum.

The K-doped $SrCu_2O_2$ thin film was measured for light transmission characteristics. FIG. 3(b) represents its transmission spectrum. From this spectrum, the $SrCu_2O_2$ thin film was confirmed to be transparent in the visible and infrared regions. Also from this spectrum, the bandgap of the $SrCu_2O_2$ thin film was calculated to be about 3.3 eV.

The electric conductivity of the K-doped $SrCu_2O_2$ thin film was measured over the range from 150K to 300K by the two-terminal method. The results are shown in FIG. 4(b). The conductivity was $4.8\times10^{-2}$ S/cm at 300K. From the measurement of Seebeck constant and Hall constant, the film was confirmed to be p-type conductive. The film had a carrier concentration of about $6.1\times10^{17}$ cm$^{-3}$ and a mobility of about 0.46 cm$^2$V$^{-1}$s$^{-1}$.

BENEFITS OF THE INVENTION

The invention is successful in providing an oxide thin film which exhibits a widegap or transparency and p-type conductivity although it has heretofore been very difficult to form.

What is claimed is:

1. An oxide thin film formed on a substrate, comprising $SrCu_2O_2$ and exhibiting p-type conductivity at a bandgap of at least 2 eV.

2. The oxide thin film of claim 1 which is doped with potassium.

3. The oxide thin film of claim 1, wherein said oxide thin film has an Sr/Cu ratio of 0.8 to 1.3.

4. The oxide thin film of claim 1, wherein said oxide thin film has an O/(Sr+Cu) ratio of 0.55 to 0.75.

5. The oxide thin film of claim 1, wherein said oxide thin film has an Sr/Cu ratio of 0.9 to 1.2.

6. The oxide thin film of claim 1, wherein said oxide thin film has an O/(Sr+Cu) ratio of 0.65 to 0.70.

7. The oxide thin film of claim 2, wherein said oxide thin film has a K/Sr ratio of 0.05 or less.

8. The oxide thin film of claim 2, herein said oxide thin film has an Sr:K ratio of 0.97:0.03.

9. The oxide thin film of claim 1, which is in a form selected from the group consisting of an amorphous thin film, microcrystalline thin film, polycrystalline thin film, epitaxial thin film, single crystal thin film, and a mixture thereof.

10. The oxide thin film of claim 1, which is in a form selected from the group consisting of a multilayer thin film and an artificial lattice thin film.

11. The oxide thin film of claim 1, wherein said substrate is an amorphous substrate selected from the group consisting of glass, quartz, and organic material.

12. The oxide thin film of claim 1, wherein said substrate is a crystalline, insulating material selected from the group consisting of magnesia, strontium titanate, sapphire, zirconia, stabilized zirconia, lithium niobate, and lithium tantalate.

13. The oxide thin film of claim 1, wherein said substrate is a semiconductor selected from the group consisting of gallium arsenide, silicon, ZnSe, ZnS, GaP, and InP.

14. The oxide thin film of claim 1, wherein said substrate further comprises a film or layer selected from the group consisting of crystalline buffer layer, amorphous buffer layer, metallic buffer layer, and functional film.

15. The oxide thin film of claim 14, wherein said functional film is an n-type oxide functional film selected from the group consisting of ITO and ZnO.

16. The oxide thin film according to claim 1, wherein said substrate is a metal substrate selected from the group consisting of Mo, Al, Pt, Ir, Au, and Pd.

17. The oxide thin film of claim 1, wherein said substrate is transparent.

18. The oxide thin film of claim 1, wherein said oxide thin film comprises a surface roughness Rz of 1 to 10 nm.

19. The oxide thin film of claim 1, wherein said oxide thin film has a thickness of 5 nm to 3 μm.

20. A transparent electrode, transistor functional film, solar battery, or organic EL, comprising the oxide thin film of claim 1.

* * * * *

UNITED STATES PATENT AND TRADEMARK OFFICE
CERTIFICATE OF CORRECTION

PATENT NO.   : 6,294,274 B1
DATED        : September 25, 2001
INVENTOR(S)  : Hiroshi Kawazoe et al.

It is certified that error appears in the above-identified patent and that said Letters Patent is hereby corrected as shown below:

<u>Title page,</u>
Item [75], "Sakac-Ku" should read -- Sakae-ku --.

<u>Column 6,</u>
Line 11, "herein" should read -- wherein --.

Signed and Sealed this

Fourth Day of June, 2002

Attest:

JAMES E. ROGAN
Attesting Officer    Director of the United States Patent and Trademark Office